(12) United States Patent
McClellan et al.

(10) Patent No.: US 7,871,275 B1
(45) Date of Patent: Jan. 18, 2011

(54) INTERPOSER FRAME ASSEMBLY FOR MATING A CIRCUIT BOARD WITH AN INTERPOSER ASSEMBLY

(75) Inventors: Justin Shane McClellan, Camp Hill, PA (US); Nathan William Swanger, Mechanicsburg, PA (US); Justin M'Cheyne Reisinger, Carlisle, PA (US); Jeffrey Byron McClinton, Harrisburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 12/631,384

(22) Filed: Dec. 4, 2009

(51) Int. Cl.
*H01R 12/00* (2006.01)
(52) U.S. Cl. ..................................................... 439/71
(58) Field of Classification Search ............... 439/71, 439/526
See application file for complete search history.

(56) References Cited

U.S. PATENT DOCUMENTS

| | | | | |
|---|---|---|---|---|
| 4,144,648 A * | 3/1979 | Grovender | .................. | 439/331 |
| 4,381,131 A * | 4/1983 | Demnianiuk | ................ | 439/368 |
| 4,511,201 A * | 4/1985 | Baker et al. | .................. | 439/260 |
| 4,593,961 A * | 6/1986 | Cosmo | ........................ | 439/66 |
| 4,652,973 A * | 3/1987 | Baker et al. | .................. | 361/739 |
| 4,674,811 A * | 6/1987 | Corwin | ........................ | 439/69 |
| 5,176,524 A * | 1/1993 | Mizuno et al. | ................ | 439/68 |
| 5,226,823 A * | 7/1993 | Johnson | ........................ | 439/66 |
| 5,241,453 A * | 8/1993 | Bright et al. | ................ | 361/704 |
| 5,302,853 A * | 4/1994 | Volz et al. | .................... | 257/707 |
| 5,418,469 A * | 5/1995 | Turner et al. | ................ | 324/755 |
| 5,468,996 A * | 11/1995 | Chan et al. | ................... | 257/723 |
| 5,477,161 A * | 12/1995 | Kardos et al. | ................ | 324/755 |
| 5,493,475 A * | 2/1996 | Lin | ............................ | 361/710 |
| 5,738,531 A * | 4/1998 | Beaman et al. | ............... | 439/71 |
| 5,997,316 A * | 12/1999 | Kunzel | ........................ | 439/73 |
| 6,164,980 A * | 12/2000 | Goodwin | ..................... | 439/70 |
| 6,198,630 B1 * | 3/2001 | Cromwell | .................... | 361/704 |
| 6,217,361 B1 * | 4/2001 | Murr | .......................... | 439/342 |
| 6,243,267 B1 * | 6/2001 | Chuang | ...................... | 361/704 |
| 6,722,896 B2 * | 4/2004 | McGrath et al. | .............. | 439/71 |
| 6,752,645 B2 * | 6/2004 | Nakamura et al. | .......... | 439/330 |
| 6,780,056 B1 * | 8/2004 | Neidich | ................. | 439/607.35 |
| 6,781,837 B2 * | 8/2004 | Kannmacher et al. | ....... | 361/704 |
| 6,792,375 B2 * | 9/2004 | Colbert et al. | .............. | 702/117 |
| 6,793,504 B2 * | 9/2004 | Noda et al. | .................... | 439/71 |
| 6,821,163 B2 * | 11/2004 | McHugh et al. | .......... | 439/733.1 |
| 6,835,072 B2 * | 12/2004 | Simons et al. | ................ | 439/66 |
| 6,929,484 B2 * | 8/2005 | Weiss et al. | ................... | 439/66 |
| 6,929,505 B2 * | 8/2005 | He et al. | ..................... | 439/526 |
| 6,945,788 B2 | 9/2005 | Trout et al. | | |
| 7,056,130 B1 | 6/2006 | McAlonis et al. | | |
| 7,059,869 B2 | 6/2006 | Wertz et al. | | |

(Continued)

*Primary Examiner*—T C Patel
*Assistant Examiner*—Vladimir Imas

(57) ABSTRACT

An interposer frame assembly includes a static frame and a biasing frame. The static and biasing frames include legs joined with and oriented at an angle with respect to one another. The legs include mounting surfaces and opposite upper surfaces that are interconnected by an inner side. The mounting surfaces have outwardly protruding posts and the inner sides have protrusions extending away from the legs. The posts are received in openings of an interposer assembly such that the static frame and the biasing frame are aligned on opposite sides of a contact field of the interposer assembly. The protrusions of the static frame and the biasing members of the biasing frame guide and retain a circuit board with contacts into a mated relationship with corresponding contacts in the contact field of the interposer assembly.

20 Claims, 5 Drawing Sheets

U.S. PATENT DOCUMENTS

| | | |
|---|---|---|
| 7,090,507 B2 | 8/2006 | Wertz et al. |
| 7,458,820 B2 * | 12/2008 | Ohta .......................... 439/73 |
| 7,510,427 B2 * | 3/2009 | Szu ........................... 439/526 |
| 7,537,462 B2 * | 5/2009 | Higuchi et al. ............... 439/71 |
| 7,575,460 B2 * | 8/2009 | Kenzo et al. ................ 439/331 |
| 7,614,885 B2 * | 11/2009 | Liao et al. .................... 439/71 |
| 7,651,367 B2 * | 1/2010 | Chang et al. ................ 439/526 |
| 7,654,862 B2 * | 2/2010 | Liao et al. ................... 439/526 |
| 7,666,029 B2 * | 2/2010 | Lin ............................ 439/526 |
| 7,714,602 B2 * | 5/2010 | Naito et al. ................. 324/765 |
| 2003/0032322 A1 * | 2/2003 | Nakamura et al. .......... 439/330 |
| 2004/0175986 A1 * | 9/2004 | Liao et al. ................... 439/526 |
| 2004/0242057 A1 * | 12/2004 | DeFord ..................... 439/526 |
| 2005/0095906 A1 * | 5/2005 | He et al. .................... 439/526 |
| 2008/0233788 A1 * | 9/2008 | Chang et al. ................ 439/331 |
| 2009/0075512 A1 * | 3/2009 | Liao et al. ................... 439/345 |
| 2009/0221158 A1 * | 9/2009 | Fan et al. ..................... 439/71 |

* cited by examiner

INTERPOSER FRAME ASSEMBLY FOR MATING A CIRCUIT BOARD WITH AN INTERPOSER ASSEMBLY

BACKGROUND OF THE INVENTION

The subject matter herein relates generally to interconnecting circuit boards, and more particularly, to interposer assemblies that are configured to electrically interconnect different circuit boards with each other.

Interposer assemblies include a planar body that includes one or more contacts extending therethrough. The contacts protrude from each of the opposite sides of the planar body. A first circuit board that includes conductive traces and/or pads on one side mates with the contacts protruding from one side of the planar body. A second circuit board that also includes conductive traces and/or pads on one side mates with the contacts protruding from the opposite side of the planar body. The circuit boards sandwich the interposer assembly between the circuit boards and are electrically coupled with one another by the contacts in the interposer assembly.

In order for the conductive pads and/or traces of the circuit boards to mate with the contacts of the interposer assembly, the conductive pads/traces must be aligned with the contacts. Some known interposer assemblies include frames mounted to the opposite sides of the interposer assemblies. These frames are positioned on the interposer assemblies to guide the circuit boards toward the contacts in the interposer assembly. For example, the frames may at least partially encircle or extend around the outer perimeter of the contacts on one or more of the sides of the interposer assembly. A circuit board may engage or be placed within the frame(s) on one side of the interposer assembly to align the pads/traces of the circuit board with the contacts of the interposer assembly.

But, the frames mounted to the interposer assembly may include dimensional faults that can lead to misalignment between the pads/traces of the circuit board and the contacts of the interposer assembly. For example, frames that are molded from dielectric materials may be warped or twisted such that the frames cannot be mounted on the interposer assembly to align the circuit board with the contacts. The dimensional tolerances of the interposer assembly may be relatively small such that the warped or twisted frames may be unusable.

A need exists for an interposer assembly that includes a frame to guide and align a circuit board in a mated relationship with contacts in the interposer assembly while allowing for dimensional faults in the frame.

BRIEF DESCRIPTION OF THE INVENTION

In one embodiment, an interposer frame assembly is provided. The interposer frame assembly includes a static frame and a biasing frame. The static frame includes legs joined with and oriented at an angle with respect to one another. Each of the legs includes a mounting surface and an opposite upper surface that are interconnected by an inner side. The mounting surfaces have outwardly protruding posts and the inner sides have protrusions extending away from the legs. The biasing frame includes legs joined with and oriented at an angle with respect to one another, with each of the legs having a mounting surface and an opposite upper surface that are interconnected by an inner side. The mounting surfaces include outwardly protruding posts and the inner sides have biasing members. The posts of the static frame and the biasing frame are configured to be received in openings of an interposer assembly such that the static frame and the biasing frame are aligned on opposite sides of a contact field of the interposer assembly. The protrusions of the static frame and the biasing members of the biasing frame are configured to guide and retain a circuit board with contacts into a mated relationship with corresponding contacts in the contact field of the interposer assembly.

In another embodiment, another interposer frame assembly is provided. The interposer frame assembly includes a static frame and a biasing frame. The static frame includes legs joined with and oriented at an angle with respect to one another. Each of the legs includes a mounting surface and an opposite upper surface interconnected by an inner side. The mounting surfaces have outwardly protruding posts and the inner sides include protrusions extending away from the legs. The biasing frame includes legs joined with and oriented at an angle with respect to one another. Each of the legs includes a mounting surface and an opposite upper surfaces interconnected by an inner side. The mounting surfaces have outwardly protruding posts and the inner sides have biasing members. The posts of the static frame and the biasing frame are configured to be received in openings of an interposer assembly such that the static frame and the biasing frame are aligned on opposite sides of a contact field of the interposer assembly with the legs of each of the static frame and the biasing frame being oriented in perpendicular relationships with respect to each other.

DETAILED DESCRIPTION OF THE INVENTION

Figure 1:
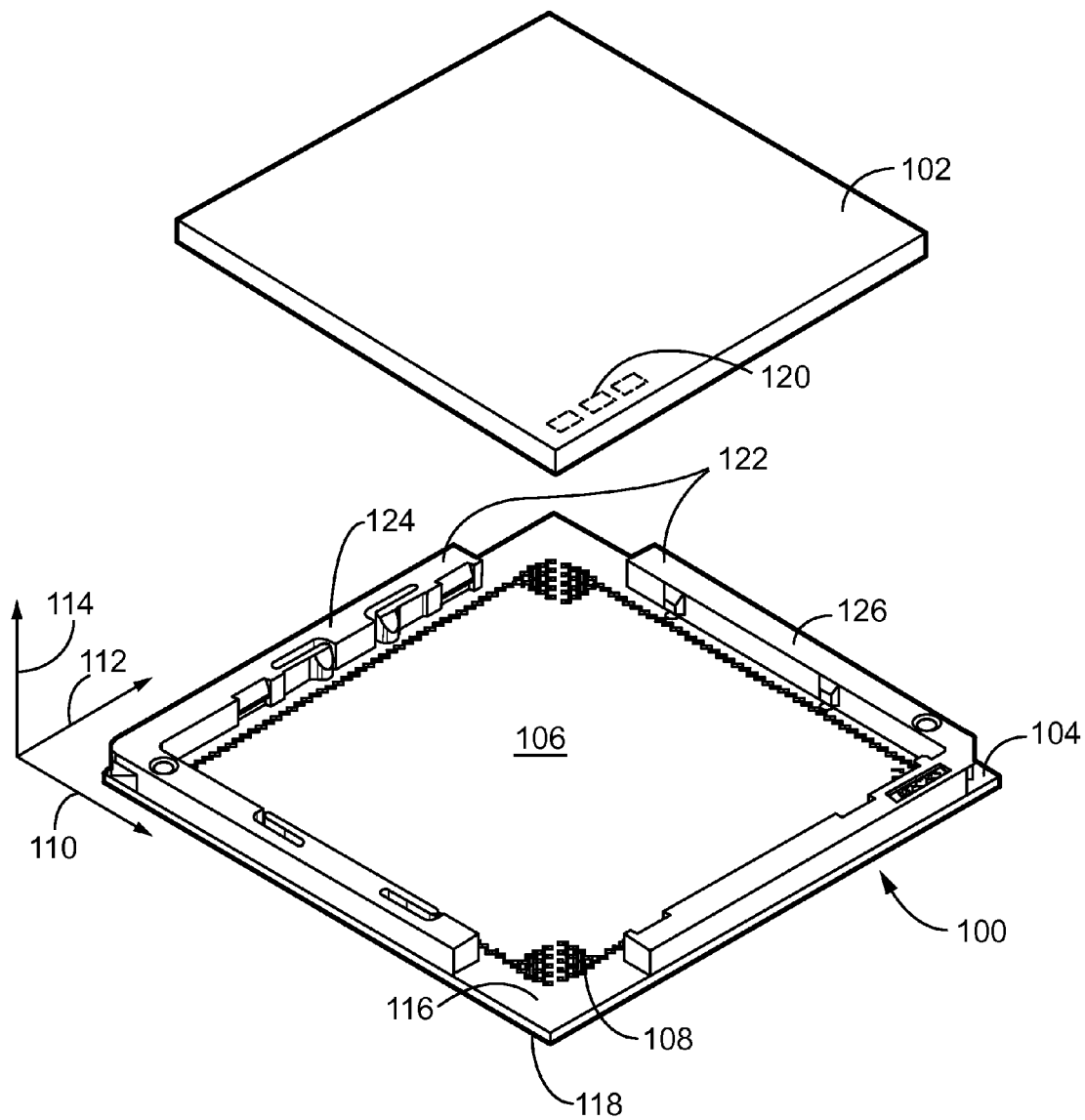
FIG. 1 is a perspective view of an interposer assembly and a circuit board in a decoupled state in accordance with one embodiment of the present disclosure.
Figure 2:
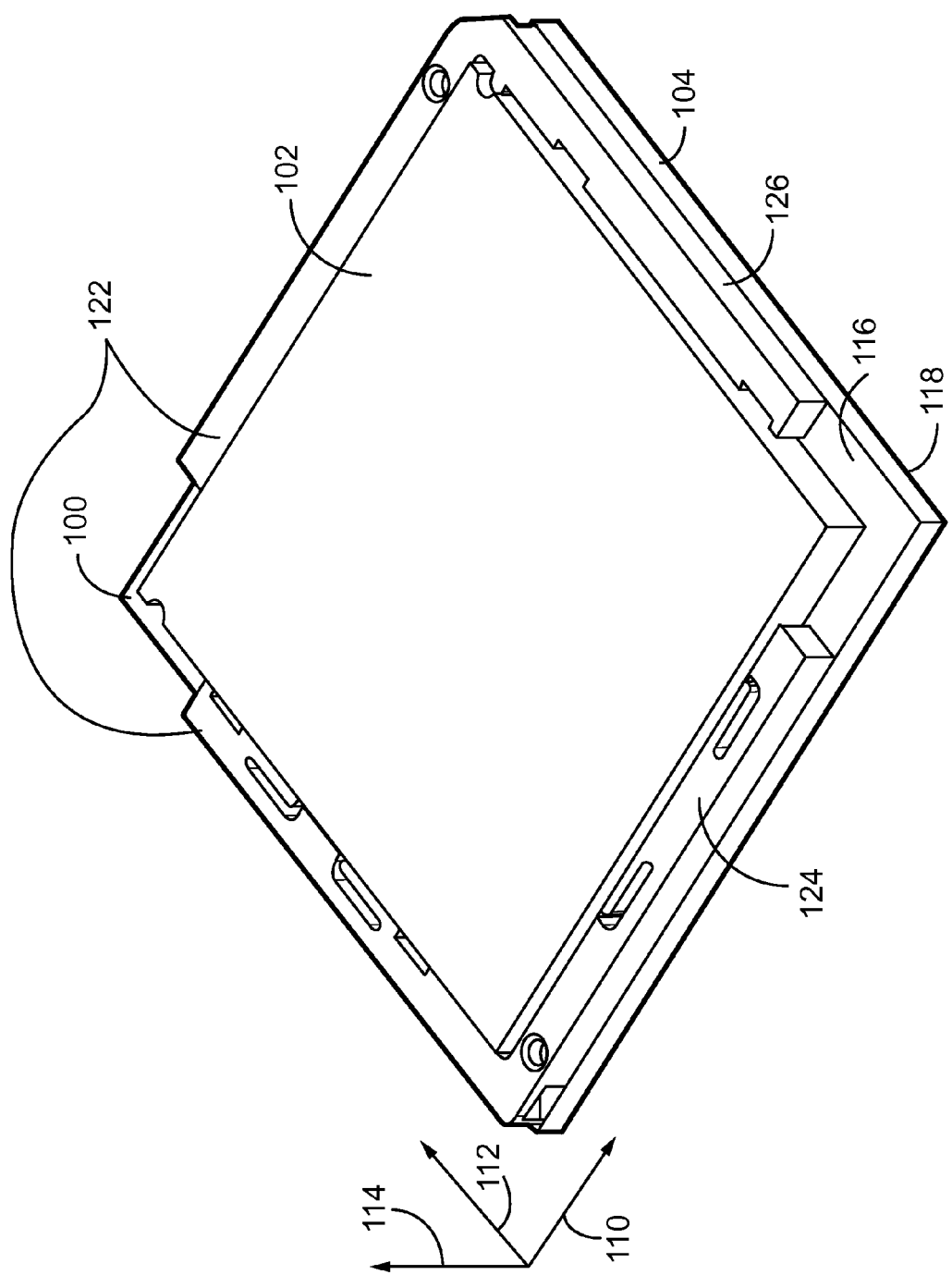
FIG. 2 is a perspective view of the interposer assembly and circuit board shown in FIG. 1 in a mated relationship in accordance with one embodiment of the present disclosure.

FIG. 1 is a perspective view of an interposer assembly 100 and a circuit board 102 in a decoupled state in accordance with one embodiment of the present disclosure. FIG. 2 is a perspective view of the interposer assembly 100 and the circuit board 102 in a mated relationship in accordance with one embodiment of the present disclosure. The interposer assembly 100 has a planar body 104 that extends between opposite sides 116, 118. The body 104 is planar in that the body 104 has greater outer dimensions in two perpendicular directions than an outer dimension in a third perpendicular direction. For example, the body 104 may be larger in directions that are parallel to a longitudinal axis 110 and a lateral axis 112 than a thickness of the body 104 that is measured in a direction parallel to a transverse axis 114.

The body 104 includes a contact field 106 (shown in FIG. 1) that includes several contacts 108 (shown in FIG. 1). The contact field 106 represents an area of the body 104 that encompasses the contacts 108. For the sake of clarity, only some of the contacts 108 are shown along the outer perimeter of the contact field 106. The contact field 106 may be substantially full of contacts 108 arranged in a regular grid or arrangement. For example, the contacts 108 may be arranged in a regular array throughout the contact field 106. The contacts 108 extend through the body 104 from one side 116 to the other side 118. The contacts 108 may protrude from each of the sides 116, 118. The contacts 108 mate with and electrically join circuit boards 102 on opposite sides of the interposer assembly 100. For example, a first circuit board 102 may include contacts 120 (shown in FIG. 1) disposed on one side of the circuit board 102. The circuit board 102 may be an Application Specific Integrated Circuit (ASIC). The contacts 120 may be conductive pads or traces disposed on a surface of the circuit board 102. For example, the contacts 120 may be a Land Grid Array (LGA) of conductive pads. The first circuit board 102 engages the side 116 of the interposer assembly 100 along a direction that is parallel to the transverse axis 114 to mate the contacts 120 of the first circuit board 102 with the contacts 108 of the interposer assembly 100. A second circuit board 102 may engage the opposite side 118 of the interposer assembly 100 in a direction that is parallel to the transverse axis 114 and opposite of the direction that the first circuit board 102 engages the interposer assembly 100. The second circuit board 102 mates the contacts 120 of the second circuit board 102 with the contacts 108 of the interposer assembly 100 at the opposite side 118. The contacts 108 extending through the interposer assembly 100 electrically couple the two circuit boards 102 that are mated with the opposite sides 116, 118 of the interposer assembly 100.

The interposer assembly 100 includes an interposer frame assembly 122 that is mounted to at least one of the sides 116, 118. While the frame assembly 122 is shown as mounted only to the side 116, alternatively the frame assembly 122 may be mounted to the side 118 or several frame assemblies 122 may be provided with at least one frame assembly 122 mounted to each side 116, 118. While the discussion herein focuses on a frame assembly 122 mounted to the side 116, the description may apply equally to a frame assembly 122 mounted to the side 118.

The frame assembly 122 guides and retains the circuit board 102 in a mated relationship with the interposer assembly 100. For example, the frame assembly 122 may guide the circuit board 102 such that the contacts 120 (shown in FIG. 1) of the circuit board 102 are registered with the contacts 108 (shown in FIG. 1) in the contact field 106 (shown in FIG. 1) on the side 116. The contacts 120 are registered with the contacts 108 of the interposer assembly 100 when the contacts 120 are aligned with the contacts 108 protruding from the side 116 in directions that are parallel to each of the longitudinal and lateral axes 110, 112.

The frame assembly 122 is a sectioned frame assembly in the illustrated embodiment. For example, the frame assembly 122 includes two separate frames 124, 126 that are separate from one another. The frames 124, 126 include a biasing frame 124 and a static frame 126. As shown in FIG. 1, the biasing and static frames 124, 126 are discrete components that are spatially separated from one another such that the biasing and static frames 124, 126 are not joined, coupled, or connected with each other. Alternatively, the biasing and static frames 124, 126 may be joined together. For example, the biasing and static frames 124, 126 may be fastened together or formed as a single continuous body.

The biasing and static frames 124, 126 oppose one another when mounted to the side 116 of the interposer assembly 100. The biasing and static frames 124, 126 are mounted on opposite sides of the contact field 106 in the illustrated embodiment. For example, the biasing frame 124 extends along two sides of the contact field 106 (shown in FIG. 1) and the static frame 126 extends along two sides of the contact field 106 that are disposed opposite of the sides along which the biasing frame 124 is disposed. The circuit board 102 is moved in a direction parallel to the transverse axis 114 toward the side 116 of the interposer assembly 100. The circuit board 102 is received between the biasing and static frames 124, 126 and is secured in a mated relationship with the interposer assembly 100 between the biasing and static frames 124, 126.

Figure 3:
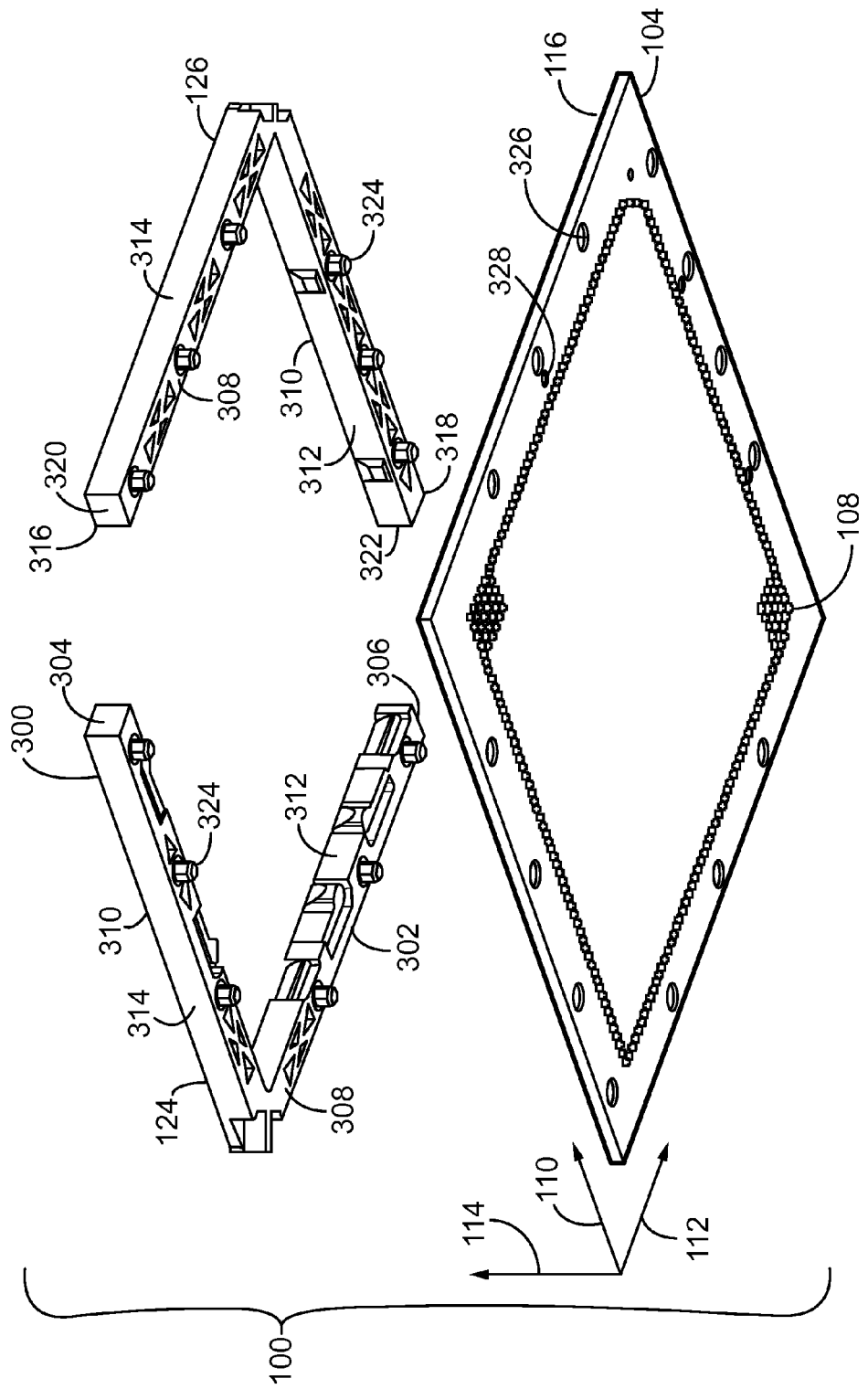
FIG. 3 is an exploded view of the interposer assembly shown in FIG. 1 in accordance with one embodiment of the present disclosure.

FIG. 3 is an exploded view of the interposer assembly 100 in accordance with one embodiment of the present disclosure. The biasing frame 124 and static frame 126 are shown in FIG. 3 as decoupled or separated from the body 104 of the interposer assembly 100. The biasing frame 124 and static frame 126 may include or be formed from a dielectric material. For example, the biasing and static frames 124, 126 may be separately molded from one or more polymers. The biasing frame 124 includes two legs 300, 302 that are joined with one another. The leg 300 extends from the leg 302 to an outer end 304. The leg 302 extends from the leg 300 to an outer end 306. The legs 300, 302 are oriented at an angle with respect to each other. The legs 300, 302 may be approximately perpendicular to each other. For example, the leg 300 may extend from the leg 302 in a direction that is generally or approximately parallel to the longitudinal axis 110 and the leg 302 may extend from the leg 300 in a direction that is generally or approximately parallel to the lateral axis 112. During fabrication of the biasing frame 124, however, the legs 300, 302 may be slightly warped such that the leg 300 is not oriented at a ninety degree angle with respect to the leg 302. As described below, the biasing frame 124 may include self-alignment features that orient the legs 300, 302 in a predetermined relationship with respect to one another regardless of warp and other imperfections in the legs 300, 302.

Each of the legs 300, 302 extends from a mounting surface 308 to an opposite upper surface 310 in a direction oriented parallel to the transverse axis 114. The leg 300 extends from an inner side 312 to an opposite outer side 314 in a direction oriented parallel to the lateral axis 112. The leg 302 extends from a corresponding inner side 312 to a corresponding outer side 314 in a direction oriented parallel to the longitudinal axis 110. The inner and outer sides 312, 314 interconnect the mounting surfaces 308 with the upper surfaces 310.

The static frame 126 includes two legs 316, 318 that are joined with one another. The legs 316, 318 extend from one another to corresponding outer ends 320, 322. The legs 316, 318 are oriented at an angle with respect to each other. The legs 316, 318 may be approximately perpendicular to each other. Similar to the legs 300, 302 of the biasing frame 124, each of the legs 316, 318 extends from a mounting surface 308 to an opposite upper surface 310 in a direction oriented parallel to the transverse axis 114. The leg 318 extends from an inner side 312 to an opposite outer side 314 in a direction oriented parallel to the lateral axis 112. The leg 316 extends from a corresponding inner side 312 to a corresponding outer side 314 in a direction oriented parallel to the longitudinal axis 110. The inner sides 312 of the legs 300, 302, 316 and 318 define a reception zone for the circuit board 102 (shown in FIG. 1) when the biasing and static frames 124, 126 are mounted on the body 104.

In the illustrated embodiment, each of the biasing and static frames 124, 126 includes posts 324 that outwardly protrude from the legs 300, 302, 316, 318. While each of the legs 300, 302, 316, 318 is shown as including three posts 324, alternatively a different number of posts 324 may be provided in one or more of the biasing and static frames 124, 126. The posts 324 outwardly protrude from the mounting surfaces 308 of the legs 300, 302 in a direction that is parallel to the transverse axis 114. The body 104 of the interposer assembly 100 includes post openings 326 that extend through the body 104. The post openings 326 are shaped and positioned to receive the posts 324 of the biasing and static frames 124, 126. The biasing and static frames 124, 126 are mounted to the body 104 by inserting the posts 324 into the post openings 326.

The insertion of the posts 324 into the post openings 326 mounts the biasing and static frames 124, 126 to the body 104 along the side 116 of the body 104 and aligns the biasing and static frames 124, 126 with the contact field 106 (shown in FIG. 1) on the side 116. As the location of the post openings 326 is fixed with respect to the contact field 106, the loading of the posts 324 into the post openings 326 may ensure that the biasing and static frames 124, 126 are aligned with the contact field 106 even if the legs 300, 302 of the biasing frame 124 and/or the legs 316, 318 of the static frame 126 are not perpendicularly oriented with respect to each other. For example, the legs 300, 302 of the biasing frame 124 and/or the legs 316, 318 of the static frame 126 may be partially warped, twisted, and the like during the manufacture of the biasing frame 124 and/or the static frame 126. Without the posts 324, the warped or twisted legs 300, 302, 316, 318 may cause the biasing frame 124 or the static frame 126 to be misaligned with respect to the contact field 106 when the biasing frame 124 or static frame 126 is mounted to the body 104. Placing the posts 324 within the post openings 326 may correct for the warpage or twists in the legs 300, 302, 316, 318 and ensure that the legs 300, 302, 316, 318 are properly aligned along the perimeter of the contact field 106. As a result, the circuit board 102 (shown in FIG. 1) may be aligned with the contact field 106 when the circuit board 102 is received between the biasing and static frames 124, 126.

Typically, the body 104 is relatively flat. The insertion of the posts 324 into the post openings 326 may ensure that the biasing and static frames 124, 126 also are flat. For example, warped or twisted legs 300, 302, 316, 318 may cause the upper surfaces 310 of the biasing frame 124 or the static frame 126 to be slightly angled with respect to the side 116 of the body when the biasing frame 124 or static frame 126 is mounted to the body 104. Placing the posts 324 within the post openings 326 may correct for the warpage or twists in the legs 300, 302, 316, 318 and ensure that the upper surfaces 310 are approximately parallel to, or flat with respect to, the side 116 of the body 104. Maintaining flat upper surfaces 310 can assist in ensuring that the contacts 120 (shown in FIG. 1) of the circuit board 102 (shown in FIG. 1) are approximately equidistant from the contacts 108 such that solder may be reflowed to electrically couple the contacts 108 with the contacts 120.

The body 104 may include alignment openings 328 that extend through the body 104. The alignment openings 328 may be referred to as inspection windows. As shown in FIG. 3, the alignment openings 328 can be positioned near or adjacent to some of the post openings 326. For example, the alignment openings 328 may be next to the post openings 326 that receive the posts 324 of the static frame 126. As described below, the alignment openings 328 may be used to provide visual verification that the static frame 126 is properly aligned on the body 104 with respect to the contact field 106 (shown in FIG. 1). In another embodiment, the alignment openings 328 may be replaced by markings placed on the side 116. As described below, the markings can be used to ensure that the static frame 126 is aligned properly on the side 116.

Figure 4:
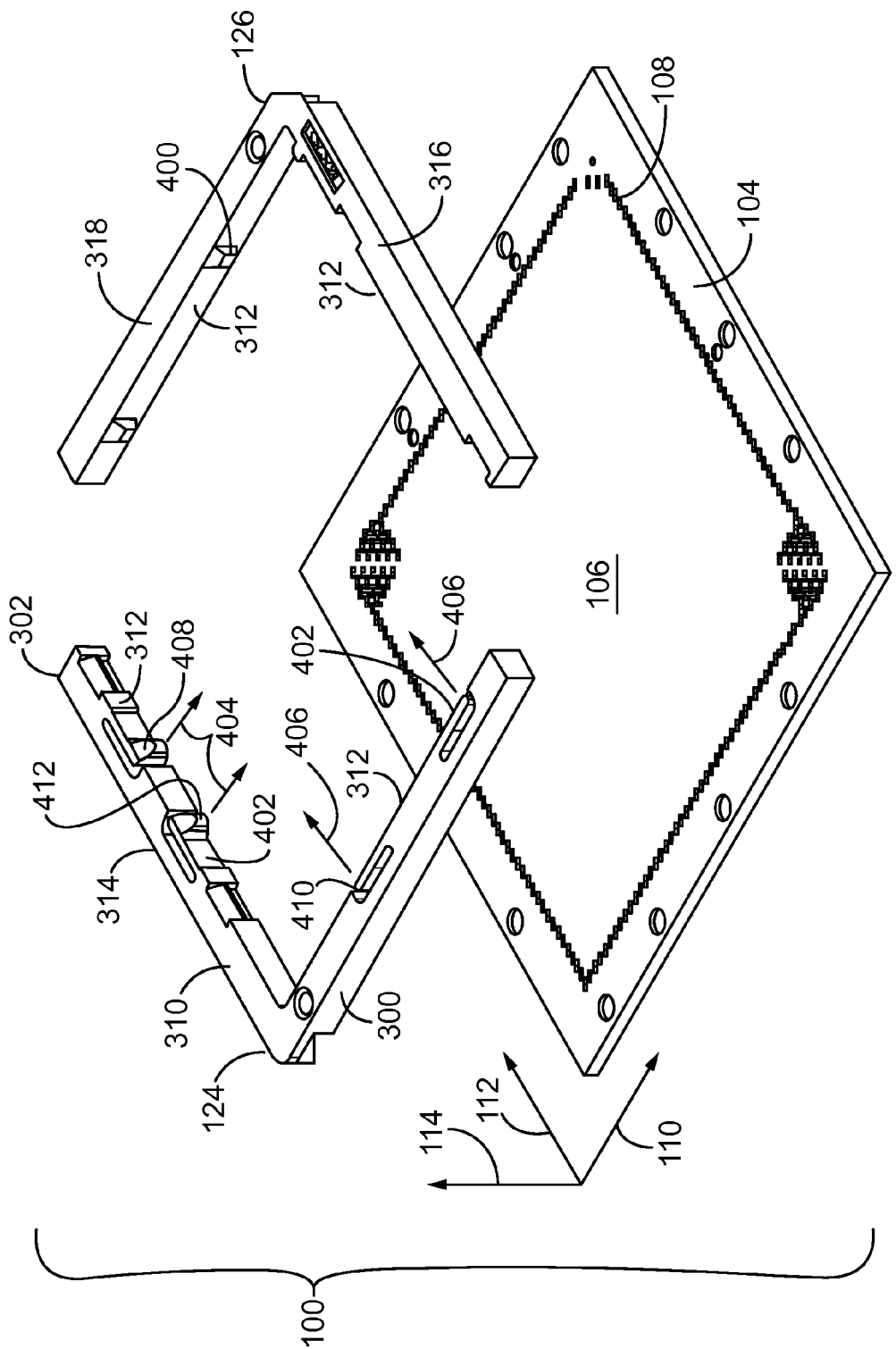
FIG. 4 is another exploded view of the interposer assembly shown in FIG. 1 in accordance with one embodiment of the present disclosure.

FIG. 4 is another exploded view of the interposer assembly 100 in accordance with one embodiment of the present disclosure. The static frame 126 includes several protrusions 400 that extend from the legs 316, 318. In the illustrated embodiment, two protrusions 400 outwardly extend from the leg 318 and a single protrusion extends from the leg 316. The protrusions 400 extend from the inner sides 312 of the leg 318 in a direction that is perpendicular to the direction of elongation of the leg 318, or in a direction that is parallel to the lateral axis 112. The protrusion 400 extends from the inner side 312 of the leg 316 in a direction that is perpendicular to the direction of elongation of the leg 316, or in a direction that is parallel to the longitudinal axis 110.

Figure 5:
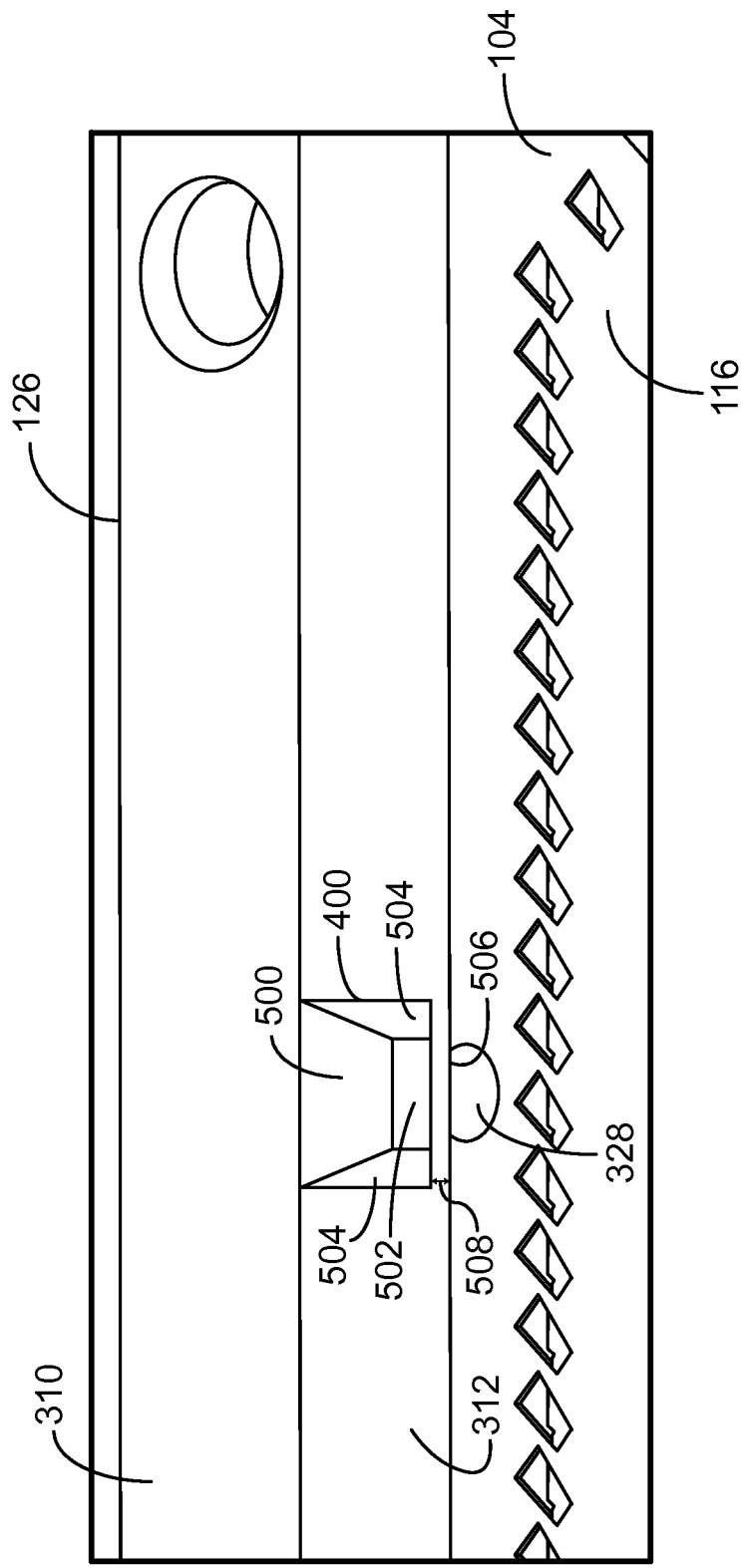
FIG. 5 is a partial view of a static frame shown in FIG. 1 mounted to a body of the interposer assembly shown in FIG. 1 in accordance with one embodiment of the present disclosure.

FIG. 5 is a partial view of the static frame 126 mounted to the body 104 of the interposer assembly 100 (shown in FIG. 1) in accordance with one embodiment of the present disclosure. The protrusion 400 shown in FIG. 5 includes a lead-in surface 500 that is obliquely angled with respect to the upper surface 310 and the inner side 312 of the static frame 126. In the illustrated embodiment, the lead-in surface 500 extends from the upper surface 310 to an end surface 502 of the protrusion 400. The lead-in surface 500 and the end surface 502 both intersect side surfaces 504 of the protrusion 400. The side surfaces 504 extend from the inner side 312 to the end surface 502. A bottom surface 506 extends from the inner side 312 to the end surface 502.

The bottom surface 506 is spatially separated from the body 104 when the static frame 126 is mounted to the body 104. As shown in FIG. 5, the bottom surface 506 is separated from the body 104 by a gap 508 in a direction that is parallel to the transverse axis 114 (shown in FIG. 1). The gap 508 permits a user of the interposer assembly 100 (shown in FIG. 1) to visually verify that the static frame 126 is properly aligned on the body 104. As described above, an alignment opening 328 or an alignment marking may be positioned next to or near a post opening 326 (shown in FIG. 3). The alignment openings 328 may be placed near the post openings 326 that correspond to the posts 324 (shown in FIG. 3) located closest to the protrusions 400. When the static frame 126 is properly aligned on the body 104, the alignment openings 328 are viewable in the gap 508 between the protrusions 400 and the body 104 by a user who is viewing the static frame 126 at an acute angle with respect to the side 116 of the body 104. For example, a user may be able to see the alignment opening 328 below the bottom surface 506 when viewing the static frame 126 and body 104. If the static frame 126 is properly aligned on the body 104, each of the alignment openings 328 are approximately centered between the end surfaces 502, 504 below the protrusion 400. For example, the center of the opening 328 may be disposed underneath and between the end surfaces 502, 504. If the alignment opening 328 is not centered or located underneath and between the end surfaces 502, 504, then the static frame 126 may not be properly aligned on the body 104.

Returning to the discussion of the interposer assembly 100 shown in FIG. 4, the biasing frame 124 includes several biasing members 402 along the inner sides 312 of the legs 300, 302. In the illustrated embodiment, each of the legs 300, 302 includes two biasing members 402, although a different number of biasing members 402 may be provided on one or more of the legs 300, 302 or no biasing members 402 may be provided on one or more of the legs 300, 302. The biasing members 402 are cantilevered beams that extend from the inner sides 312 to outer ends 410. Alternatively, the biasing members 402 may be springs, spring fingers, elastomeric bodies, or other components. The biasing members 402 are deflected toward the outer side 314 when the circuit board 102 (shown in FIG. 1) is loaded between the biasing frame 124 and the static frame 126. The biasing members 402 impart a directional force on the circuit board 102 when the biasing members 402 are deflected. For example, when the biasing members 402 of the leg 302 are deflected toward the outer side 314 of the leg 302, the biasing members 402 may individually impart a directional force on the circuit board 102 in the directions of arrows 404. The biasing members 402 of the leg 300 may impart directional forces on the circuit board 102 in directions of the arrows 406 when the circuit board 102 is loaded between the biasing frame 124 and the static frame 126. In the illustrated embodiment, the directional forces imparted by the biasing members 402 of the leg 300 are oriented parallel to the lateral axis 112 and perpendicular to the directional forces imparted by the biasing members 402 of the leg 302. The directional forces imparted by the biasing members 402 of the leg 302 may be oriented parallel to the longitudinal axis 110.

In the illustrated embodiment, the biasing members 402 include lead-in surfaces 408 that partially extend the biasing members 402 from the outer ends 410. The lead-in surfaces 408 may be obliquely oriented with respect to the upper surfaces 310 and the inner sides 312. The lead-in surfaces 408 extend from the upper surfaces 310 of the biasing members 402 to end surfaces 412 of the biasing members 402.

The lead-in surfaces 500 (shown in FIG. 5), 408 of the protrusions 400 and the biasing members 402 guide the circuit board 102 (shown in FIG. 1) into a mated relationship with the contact field 106 of the body 104. As the circuit board 102 is lowered onto the body 104 in a direction that is parallel to the transverse axis 114, the circuit board 102 may engage and slide along the lead-in surfaces 500, 408. The lead-in surfaces 408 of the biasing members 402 that are joined to the leg 302 of the biasing frame 124 cause the circuit board 102 to slide in a direction that is parallel to the longitudinal axis 110 and toward the leg 316 of the static frame 126. The lead-in surfaces 408 of the biasing members 402 on the leg 300 of the biasing frame 124 guide the circuit board 102 along a direction that is parallel to the lateral axis 112 and toward the leg 318 of the static frame 126. The lead-in surfaces 500 of the protrusions 400 extending from the leg 318 of the static frame 126 cause the circuit board 102 to slide toward the leg 300 of the biasing frame 124, or in a direction that is parallel to the lateral axis 112. The lead-in surfaces 500 of the protrusions 400 extending from the leg 316 guide the circuit board 102 toward the leg 302 of the biasing frame 124 and in a direction that is parallel to the longitudinal axis 110.

The sliding of the circuit board 102 along one or more of the lead-in surfaces 408, 500 (shown in FIG. 5) may assist in centering the circuit board between the biasing and static frames 124, 126 or in aligning the circuit board 102 with respect to the contact field 106. For example, if the circuit board 102 is lowered toward the body 104 with the circuit board 102 shifted too far toward the leg 318 of the static frame 126, the circuit board 102 may engage and slide along the lead-in surfaces 500 of the protrusions 400 joined to the leg 318 and be driven away from the leg 318 and toward the contact field 106. Similarly, if the circuit board 102 is shifted too far over the leg 302 of the biasing frame 124 when the circuit board 102 is lowered to the body 104, the circuit board 102 may slide along and be driven by the lead-in surfaces 408 toward the contact field 106. The lead-in surfaces 408, 500 may guide the circuit board 102 such that the circuit board 102 slides along one or more of the lead-in surfaces 500 until the circuit board 102 engages the end surfaces 412, 502 (shown in FIG. 5) of the biasing members 402 and the protrusions 400. In one embodiment, the circuit board 102 is guided by the lead-in surfaces 408, 500 until the circuit board 102 mates with the body 104 and engages at least one end surface 412, 502 of a biasing member 402 or protrusion 400 of each leg 300, 302, 316, 318. Alternatively, the circuit board 102 may be guided by the lead-in surfaces 408, 500 until the circuit board 102 mates with the body 104 and engages all of the end surfaces 412, 502 of the biasing and static frames 124, 126. Once the circuit board 102 has mated with the body 104, the contacts 120 (shown in FIG. 1) are mated with the contacts 108 of the contact field 106.

As described above, the biasing members 402 may impart directional forces on the circuit board 102 (shown in FIG. 1) when the biasing members 402 are deflected inward from the inner sides 312. The biasing members 402 may be inwardly deflected by the circuit board 102 as the circuit board 102 is loaded between the biasing frame 124 and the static frame 126. For example, the space between the end surfaces 412 of the biasing members 402 and the end surfaces 502 (shown in FIG. 5) of the protrusions 400 that oppose the biasing members 402 may be smaller than the circuit board 102 such that the circuit board 102 deflects the biasing members 402 toward the outer sides 314. The biasing members 402 may then impart the directional forces on the circuit board 102 in directions along the arrows 404, 406. The directional forces may press the end surfaces 412 of the biasing members 402 against the circuit board 102 and retain the circuit board 102 between the end surfaces 412 of the biasing members 402 and the opposing end surfaces 502 of the protrusions 400 through an interference fit. The retention of the circuit board 102 between the biasing frame 124 and the static frame 126 may prevent or impede removal of the circuit board 102 from a mated relationship with the body 104.

Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. § 112, sixth paragraph, unless and until such claim limitations expressly use the phrase "means for" followed by a statement of function void of further structure.

What is claimed is:

1. An interposer frame assembly comprising:

a static frame including first legs joined with each other and extending in different directions, the static frame including a first mounting surface configured to be mounted to an interposer assembly and a first inner side intersecting the first mounting surface and having an alignment protrusion projecting from the inner side; and a biasing frame including second legs joined with each other and extending in different directions, the biasing frame including a second mounting surface configured to be mounted to the interposer assembly and a second inner side intersecting the second mounting surface and having a biasing member coupled thereto, the alignment protrusion of the static frame and the biasing member of the biasing frame configured to guide and retain a circuit board that mates with the interposer assembly such that the circuit board is aligned with and mates with contacts in a contact field of the interposer assembly, wherein the static frame and the biasing frame are separate and spaced apart from each other when the static frame and the biasing frame are mounted to the interposer assembly.

2. The interposer frame assembly of claim 1, wherein the posts of the static frame and the biasing frame are configured to align the static frame and the biasing frame along an outer perimeter of the contact field of the interposer assembly.

3. The interposer frame assembly of claim 1, wherein each of the first legs of the static frame includes at least one of the posts of the static frame, the posts of the first legs configured to be received in openings of the interposer assembly to position the first legs of the static frame in a perpendicular relationship with respect to one another.

4. The interposer frame assembly of claim 1, wherein each of the second legs of the biasing frame includes at least one of the posts of the biasing frame, the posts of the second legs configured to be received in openings of the interposer assembly to position the second legs of the biasing frame in a perpendicular relationship with respect to one another.

5. The interposer frame assembly of claim 1, wherein the biasing member of the biasing frame is a cantilevered beam.

6. The interposer frame assembly of claim 1, wherein the alignment protrusion of the static frame includes an upper lead-in surface that is obliquely angled with respect to an upper surface of the static frame that is disposed opposite of the first mounting surface of the static frame.

7. The interposer frame assembly of claim 1, wherein the biasing member of the biasing frame moves in a direction that is oriented perpendicular to a direction that the posts of the biasing frame protrude from the second mounting surface of the biasing frame.

8. The interposer frame assembly of claim 1, wherein the biasing member of the biasing frame is configured to impart a directional force on the circuit board that is oriented toward the static frame when the biasing frame and the static frame are mounted to the interposer assembly.

9. The interposer frame assembly of claim 1, wherein the first legs of the static frame extend to first outer ends and the second legs of the biasing frame extend to second outer ends, the first outer ends spatially separated from the second outer ends when the static frame and the biasing frame are mounted to the interposer assembly.

10. The interposer frame assembly of claim 1, wherein the alignment protrusion of the static frame is separated from the interposer assembly by a gap when the static frame is mounted to the interposer assembly such that an alignment marking or opening of the interposer assembly is visible below the alignment protrusion.

11. An interposer frame assembly comprising:
a static frame including first legs joined with each other and extending in different directions, the static frame including a first mounting surface configured to be mounted to an interposer assembly and a first inner side intersecting the first mounting surface and having an alignment protrusion projecting from the first inner side; and a biasing frame including second legs joined with each other and extending in different directions, the biasing frame including a second mounting surface configured to be mounted to the interposer assembly and a second inner side intersecting the second mounting surface and having a biasing member coupled thereto, the alignment protrusion of the static frame and the biasing member of the biasing frame configured to guide and retain a circuit board that mates with the interposer assembly such that the circuit board is aligned with and mates with contacts in a contact field of the interposer assembly, wherein the alignment protrusion of the static frame is separated from the interposer assembly by a gap when the static frame is mounted to the interposer assembly such that an alignment marking or opening of the interposer assembly is visible between below the alignment protrusion.

12. The interposer frame assembly of claim 11, wherein the static frame is separate and spaced apart from the biasing frame when the static frame and the biasing frame are mounted to the interposer assembly.

13. The interposer frame assembly of claim 11, wherein the biasing member of the biasing frame is a cantilevered beam.

14. The interposer frame assembly of claim 11, wherein the alignment protrusion of the static frame includes a lead-in surface that is obliquely angled with respect to an upper surface of the static frame that is disposed opposite of the first mounting surface.

15. The interposer frame assembly of claim 11, wherein the alignment protrusion and the posts of the static frame extend from the first legs in perpendicular directions with respect to one another.

16. The interposer frame assembly of claim 11, wherein the biasing member of the biasing frame moves in a direction that is oriented perpendicular to a direction that the posts of the biasing frame protrude from the second mounting surface of the biasing frame.

17. The interposer frame assembly of claim 11, wherein the biasing member of the biasing frame is configured to impart a directional force on the circuit board and toward the static frame when the circuit board is received between the biasing frame and the static frame to mate with the interposer assembly.

18. The interposer frame assembly of claim 11, wherein each of the first legs of the static frame and each of the second legs of the biasing frame includes a projecting post that is received in the interposer assembly to orient the first legs in a perpendicular relationship with respect to each other and to orient the second legs in a perpendicular relationship with respect to each other.

19. The interposer frame assembly of claim 11, wherein the static frame is separate and spaced apart from the biasing frame when the static and biasing frames are mounted to the interposer assembly.

20. The interposer frame assembly of claim 11, wherein the first legs of the static frame extend to first outer ends and the second legs of the biasing frame extend to second outer ends, the first outer ends spatially separated from the second outer ends when the static and biasing frames are mounted to the interposer assembly.

* * * * *

UNITED STATES PATENT AND TRADEMARK OFFICE
CERTIFICATE OF CORRECTION

| | | |
|---|---|---|
| PATENT NO. | : 7,871,275 B1 | Page 1 of 1 |
| APPLICATION NO. | : 12/631384 | |
| DATED | : January 18, 2011 | |
| INVENTOR(S) | : Justin S. McClellan et al. | |

It is certified that error appears in the above-identified patent and that said Letters Patent is hereby corrected as shown below:

Title Page
Section (75), third line, Inventor: Justin M'Cheyne Resinger, before "M'Cheyne", delete "Justin" and insert --Jason--, therefor.

Signed and Sealed this
Twenty-second Day of March, 2011

David J. Kappos
*Director of the United States Patent and Trademark Office*